United States Patent [19]
Freyman et al.

[11] Patent Number: 5,745,427
[45] Date of Patent: Apr. 28, 1998

[54] PHASE-SHIFTED EMBEDDED RAM APPARATUS AND METHOD

[75] Inventors: Ronald Lamar Freyman, Bethlehem; Clinton Hays Holder, Slatington, both of Pa.

[73] Assignee: Lucent Technologies Inc., Murray Hill, N.J.

[21] Appl. No.: 773,706

[22] Filed: Dec. 27, 1996

[51] Int. Cl.$^6$ ............................................. G11C 8/00
[52] U.S. Cl. ............................ 365/230.01; 365/233
[58] Field of Search ............................ 365/230.01, 233, 365/230.03, 203, 194

[56] References Cited

U.S. PATENT DOCUMENTS

| | | | |
|---|---|---|---|
| 5,539,693 | 7/1996 | Koshikawa | 365/233 X |
| 5,587,961 | 12/1996 | Wright | 365/233 |
| 5,621,695 | 4/1997 | Tran | 365/230.03 |

*Primary Examiner*—David C. Nelms
*Assistant Examiner*—Son Mai

[57] ABSTRACT

The present invention is an embedded random access memory device especially adapted for use with digital processors having a pipelined data architecture. In accordance with one embodiment of the present invention a write access cycle performed at a memory location within the memory device is phase shifted by one phase of a clock cycle relative an access cycle of a read operation. This is advantageous in that the integrity of data which traditionally would have been presented late in the write access cycle can still be maintained, since the entire write cycle is now shifted one phase later. A precharge signal which follows the write access is correspondingly shifted by one phase of a clock cycle. A wait state is inserted between the write access cycle and a read access cycle which directly follows in the same memory bank of the memory device. The wait state eliminates conflicts between the access cycle and the precharge cycle.

21 Claims, 2 Drawing Sheets

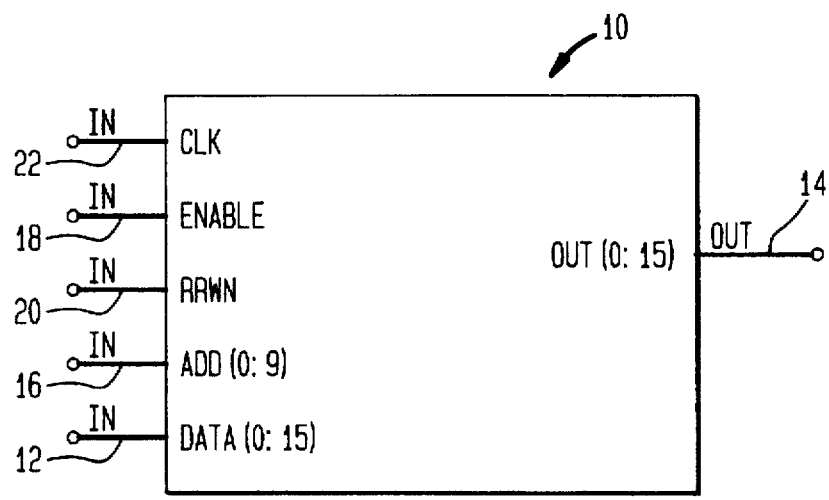
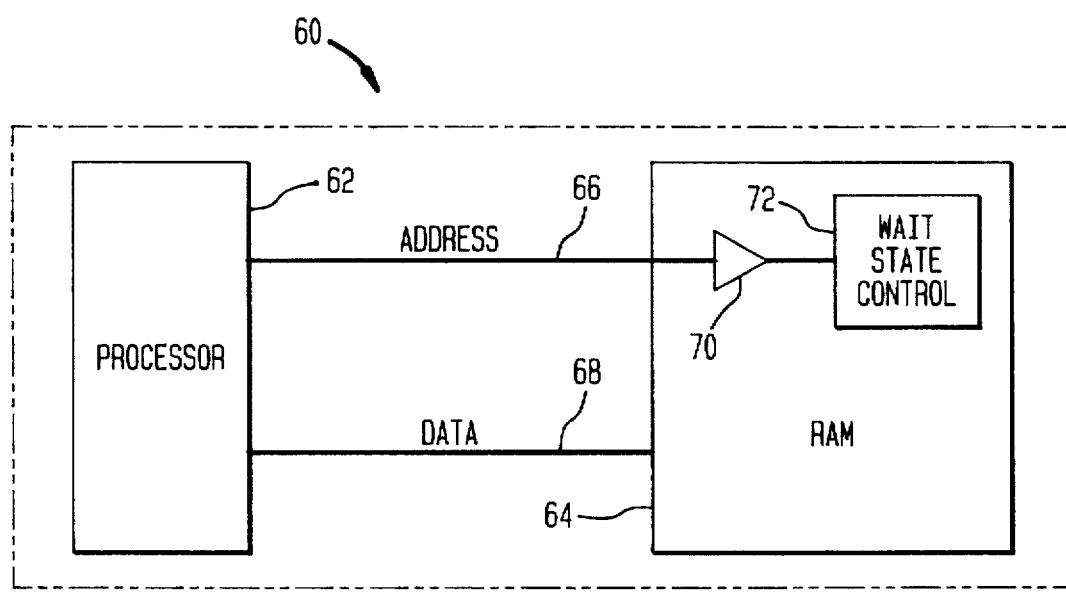

PHASE-SHIFTED EMBEDDED RAM APPARATUS AND METHOD

FIELD OF THE INVENTION

The present invention relates generally to the field of integrated circuit memory devices, and more particularly to random access memory devices for use in integrated circuits for embedded applications.

BACKGROUND OF THE INVENTION

Digital processors for use in embedded applications are taking advantage of newer data pipeline architectures to significantly increase their efficiency. As would be understood by a person skilled in the art, these pipelined architectures allow for additional processing functions to be accomplished in shorter periods of time. Because of the additional processing which takes place in these pipelined processors, a significant change has also occurred in the manner in which data is transferred to and from the processors to their corresponding embedded memory components. For example, data sent from a pipelined processor to be written into corresponding embedded random access memory (RAM) may now be presented to the RAM later in the write cycle (sometimes up to one phase of a clock cycle) due to the additional processing. Thus, data to be written to an embedded RAM component, for example a static random access memory or SRAM, may only become valid after the write access of the RAM has already begun, possibly jeopardizing the integrity of the written data.

One method in the prior art to address such a situation is to lengthen the internal RAM access into the precharge phase of the memory operation which, as would be understood, shortens the precharge time. This methodology involves tight timing control of both the lengthened access phase and the shortened precharge phase of operation for the RAM component. Such a design lends itself to less of a margin for manufacturability, for example, in terms of tolerances, which translates into increased manufacturing costs or an impractical design as a whole. Accordingly, there is a need for a more reliable design for embedded random access memory components which interface with processors having highly efficient data pipeline architectures.

SUMMARY OF THE INVENTION

The present invention is an embedded random access memory device especially adapted for use with digital processors having a data pipeline architecture. In accordance with one embodiment of the present invention a write access cycle performed at a memory location within the memory device is phase shifted by one phase of a clock cycle relative an access cycle of a read operation. This is advantageous in that the integrity of data which traditionally would have been presented late in the write access cycle can still be maintained, since the entire write cycle is now shifted one phase later. A precharge signal which follows the write access is correspondingly shifted by one phase of a clock cycle. A wait state is inserted between the write access cycle and a read access cycle which directly follows in the same memory bank of the memory device. The wait state eliminates conflicts between the access cycle and the precharge cycle.

BRIEF DESCRIPTION OF THE DRAWINGS

FIG. 1 shows a block diagram illustrating external connections to one exemplary embodiment of random access memory component according to the present invention;

FIG. 4 shows one embodiment of an application specific integrated circuit incorporating the phase shifted random access memory of the present invention.

DETAILED DESCRIPTION

Referring to FIG. 1, there is shown a block diagram for one exemplary embodiment of a random access memory (RAM component 10 in accordance with the present invention. FIG. 1 illustrates the connection terminals of the RAM component 10, which is preferably an embedded static random access memory or SRAM for use with a processor having a data pipeline architecture wherein the combination could be contained in an applications specific integrated circuit (ASIC). As shown, the RAM component 10 is a 16-bit RAM having a data bus 12 for writing data into memory locations of the RAM component 10 and another set of output lines 14 for reading or outputting data from the memory locations. In addition to the two sets of data lines, the RAM component 10 includes an address 16 bus for selecting specific memory locations or memory cells to be accessed, as would be understood by a person skilled in the art. Although shown as a 16-bit device, it would be understood that other data bus and address bus sizes may also be used. Other terminals of the RAM component 10 include a chip enable line 18, read/write enable line 20 and a clock input 22 for accepting a system clock signal.

Figure 2:
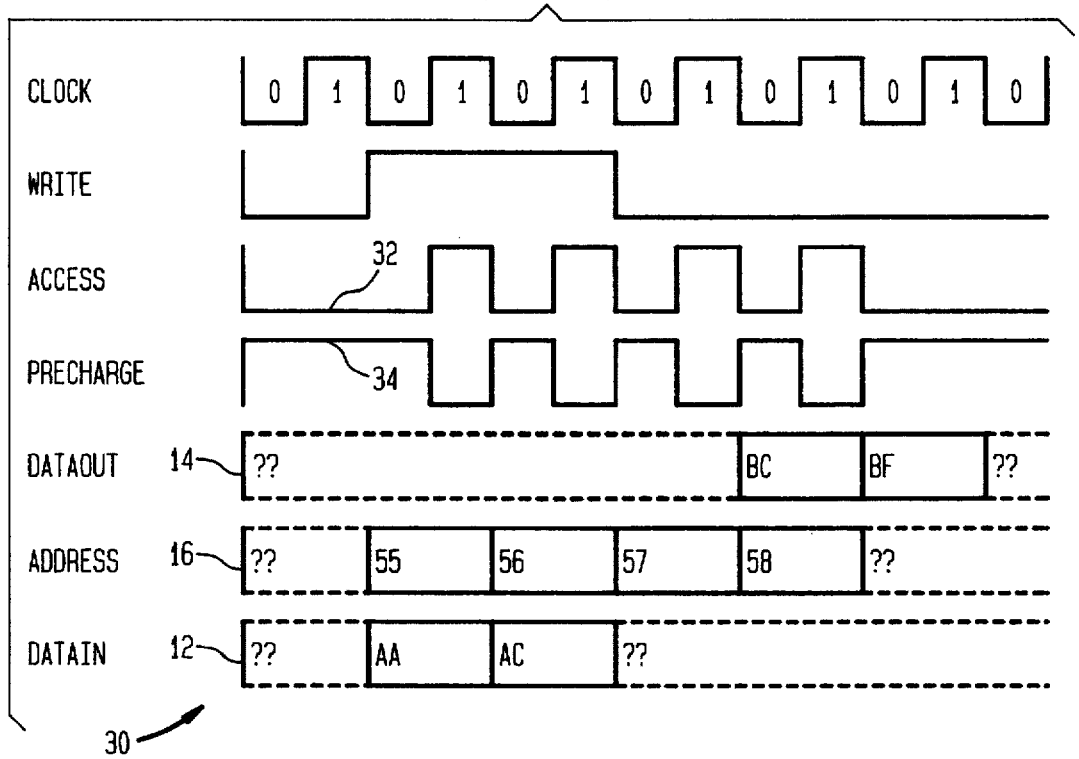
FIG. 2 shows a timing diagram for an exemplary random access memory component of the prior art.

Referring to FIG. 2 there is shown a timing diagram 30 illustrating typical operation of an embedded RAM found in the prior art. The timing diagram illustrates state values on the terminals of the RAM component 10 as shown in FIG. 1. As shown, a clock signal input to the RAM has alternating phases having values 0 and 1. The timing diagram illustrates the status of the address lines 16, data-in and data-out lines 12, 14, respectively, as they correspond to the clock signal during read and write operations. Additionally, the timing diagram shows an access signal 32 indicative of an access cycle to a memory location or cell. A precharge signal 34 is also shown in FIG. 2, where the precharge signal 34 acts to establish a precharge at a memory location to prepare for a next access to a block or bank of memory. The precharge signal 34 enables data written to a memory location to be stored more efficiently in that it is not necessary to wait for a full charge to be established for storage of data at a memory location.

The timing diagram 30 of FIG. 2 specifically illustrates two write cycles followed by two read cycles. As shown, during a write cycle, the address and data-in lines 16, 12 become valid during a clock phase 0. In a next phase 1, a write access to the memory cell occurs. This is followed by a precharge during the next phase in order to prepare for a next access. In a somewhat similar fashion, during a read cycle, the address lines become valid during clock phase 0 and the RAM location is accessed during phase 1. The data is then output on the data-out lines during a next phase 0, wherein a precharge also occurs during this phase 0.

As mentioned previously, with the advent of newer and more efficient pipeline processors, a basic change has occurred in the manner in which data is transferred to and from the processors to their corresponding memory components. Due to additional processing which takes place in the processors, it may be required that signals to the data-input of the RAM, for example an embedded RAM, be delayed by one phase of a clock cycle. Referring to the timing diagram of FIG. 1, this requirement would place data-in valid after the write access to the RAM has already begun in phase 1. As would be understood, such a scenario jeopardizes the integrity of the data to be written into the RAM.

One method in the prior art which addresses such a timing problem is to lengthen the internal RAM access into the precharge phase which, as would be understood, also shortens the precharge time. This method, however, involves tight timing control of both the lengthened access phase and the shortened precharge phase which reduces manufacturing tolerances, thereby making the manufacturing process more expensive.

The present invention takes another approach to solving the problem of a delayed presence of the data-in signal on the data bus during a write operation. Since input data to the embedded RAM is presented too late in the write access cycle to guarantee the integrity of the written data, in one exemplary embodiment of the present invention, the write cycle is shifted by one phase of a clock cycle in a piplelined fashion. As would be understood, the write access cycle could also be shifted by greater than one phase, however, one phase is the preferred amount of phase shift in that such a shift has a minimal impact on other timing parameters in the RAM while still achieving desired results.

Figure 3:
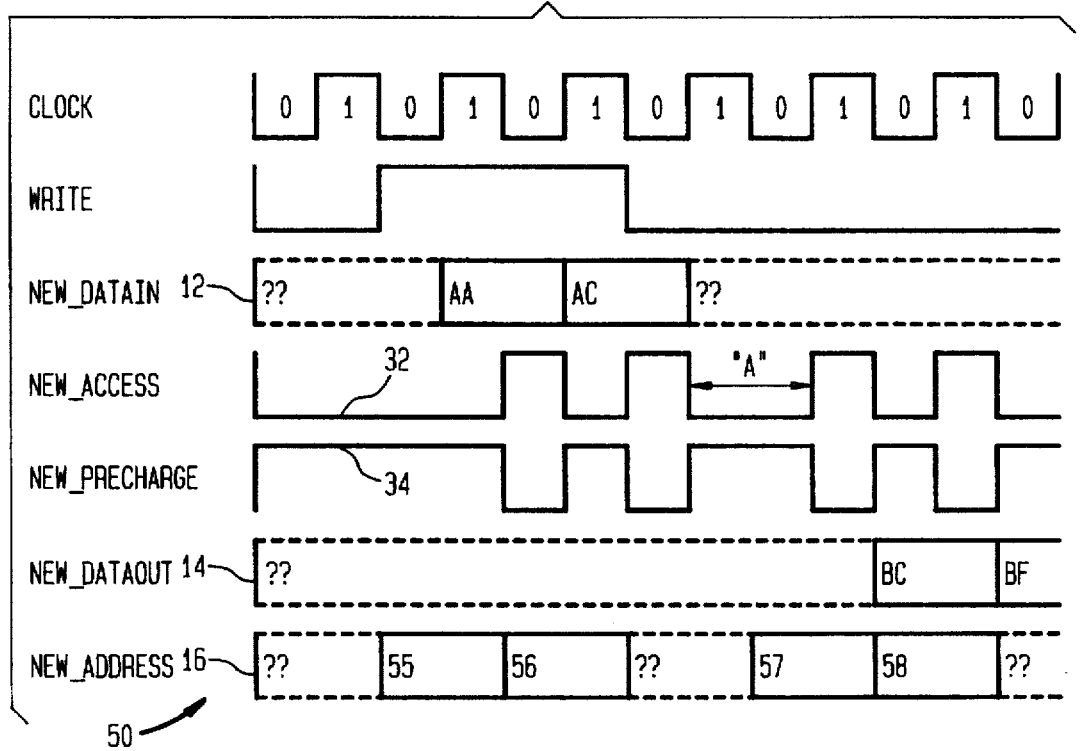
FIG. 3 shows a timing diagram for an exemplary random access memory component according to the present invention.

Referring to FIG. 3, there is shown a timing diagram 50 which illustrates operation of one embodiment of a RAM device in accordance with the present invention. As can be seen, the signal descriptions, e.g., clock, access, precharge, etc., are similar to those of FIG. 2, with the exception that those signal descriptions which differ include a prefix "NEW". As can be seen, FIG. 3 illustrates that for a write operation the data-in signal 12 becomes valid at some later time, e.g., one phase of a clock cycle, in comparison to the timing diagram of FIG. 2. The present invention is advantageous in that when the data-in becomes valid at this later time, rather than risking the possibility of storing corrupted data, the write access is phase shifted one phase later to phase 0. Correspondingly, the precharge 34 is also phase shifted one phase later and follows in phase 1. As would be understood, subsequent write operations directly following a phase-shifted write operation will also be phase-shifted by one phase as shown in FIG. 3. Advantageously, by phase shifting the write access cycle, timing problems associated with data arriving late in the write access cycle are eliminated.

Operation of the read cycle for the RAM device remains essentially the same as in the timing diagram of FIG. 2. One difference arises, however, in that a read cycle cannot directly follow a write cycle to a same physical block or bank of memory, for example, that is similarly addressed within predefined limits, and that has just experienced a phase shifted write operation. This is because if the read operation were to directly follow the write operation, there would be a direct conflict between a next precharge and the read access cycle. Accordingly, a one cycle wait state, labeled "A" in FIG. 3, is inserted between a phase shifted write access and a read operation which directly follows to the same memory bank. This essentially restores timing of the read operation to that shown in FIG. 2.

It will be noted that insertion of the wait state is only necessary when a read access directly follows a write access to the same physical bank of memory. By utilizing a proper choice of addresses for the multiple physical banks of memory that are typically contained within such a device, as can be readily accomplished with the software used in embedded applications, the wait cycle will not be necessary. Accordingly, for many uses of an embedded memory device, the wait state will have little, if no impact on the efficiency of the device.

FIG. 4 shows a simplified block diagram for one embodiment of an ASIC chip 60 for an embedded application in accordance with the present invention. As can be seen, the ASIC chip 60 includes a processor 62 and an embedded RAM memory device 64. The processor and the RAM are coupled to one another through address and data lines 66, 68, respectively, as well as other connections which would be understood by a person skilled in the art. As shown, the embedded RAM 64 includes a comparator device 70 internally coupled to the address lines 66 thereof. The comparator device 70 receives the input of the address lines 66 and based on these values will indicate to a controller 72 which bank of memory a next read or write operation is addressed. In this way, it can be determined in the RAM whether to insert a wait state between a write operation directly followed by a read operation.

From the above, it should be understood that the embodiments described, in regard to the drawings, are merely exemplary and that a person skilled in the art may make variations and modifications to the shown embodiments without departing from the spirit and scope of the invention. All such variations and modifications are intended to be included within the scope of the invention as defined in the appended claims.

What is claimed is:

1. A random access memory device adapted to operate in connection with a given clock signal, said clock signal having a first phase and a second phase for each clock cycle thereof, wherein a read access cycle to a memory location of said random access memory device occurs during said first phase of said clock cycle, said device comprising:

a plurality of memory cells, wherein each of said memory cells stores an individual bit of digital data; and a data bus coupled to said memory cells for providing means to communicate said digital data to and from said memory cells during write and read operations, wherein during a write operation to a designated memory location of said random access memory device, a write access cycle is phase shifted at least one phase later relative said read access cycle.

2. The device of claim 1, further comprising a charge line for providing a precharge signal to said memory cells, wherein said precharge signal following said write access cycle to said designated memory location is correspondingly phase shifted by said at least phase.

3. The device of claim 1, wherein said plurality of memory cells are divided into two or more banks of memory cells, said designated memory location being located in a first bank of said memory cells, wherein said device is operable to insert a wait state to delay access to a memory location in said first bank of memory cells when a read operation to said first bank of memory cells directly follows said write operation at said designated memory location.

4. The device of claim 3, wherein said wait state is one clock cycle.

5. The device of claim 1, further comprising an address bus coupled to said memory cells for providing addresses to access specific ones of said memory cells.

6. The device of claim 3, further comprising a comparator device coupled to said address bus for determining which of said banks of memory cells will be accessed during a next read or write operation.

7. The device of claim 1, further comprising:

a read/write enable line coupled to said memory cells for indicating a read or write operation at specific ones of said memory cells being accessed.

8. The device of claim 1, wherein said random access memory device is embedded memory adapted for use with a digital processor having a data pipeline architecture.

9. An integrated circuit including embedded random access memory therein, said random access memory adapted to operate in connection with a pipeline processor utilizing a clock signal, said clock signal having a first phase and a second phase for each clock cycle thereof, wherein a read access cycle to a memory location of said random access memory occurs during said first phase of said clock cycle, said integrated circuit comprising:

a plurality of memory cells, wherein each of said memory cells stores an individual bit of digital data;

an address bus coupled to said memory cells for providing addresses to access specific ones of said memory cells; and a data bus coupled to said memory cells for providing means to communicate said digital data to and from said memory cells during write and read operations, wherein during a write operation to a designated memory location of said random access memory, a write access cycle is phase shifted one phase later relative said read access cycle.

10. The integrated circuit of claim 9, further comprising a charge line for providing a precharge signal to said memory cells, wherein said precharge signal following said write access cycle to said designated memory location is correspondingly phase shifted by said one phase.

11. The integrated circuit of claim 10, wherein said plurality of memory cells are divided into two or more banks of memory cells, said designated memory cell being located in a first bank of said memory cells, wherein said device is operable to insert a wait state to delay access to a memory location in said first bank of memory cells when a read operation to said first bank of memory cells directly follows said write operation at said designated memory location.

12. The integrated circuit of claim 11, wherein said wait state is a single clock cycle.

13. The integrated circuit of claim 12, further comprising a comparator device coupled to said address bus for determining which of said banks of memory cells will be accessed during a next read or write operation.

14. The integrated circuit of claim 11, wherein an access to a memory cell during a read operation to a bank of memory cells other than one experiencing a directly preceding write operation is not delayed by said wait state.

15. The integrated circuit of claim 9, further comprising a digital processor coupled to said random access memory, said processor having a data pipeline architecture.

16. A method of operating an embedded random access memory, said random access memory adapted to operate in connection with a pipeline processor utilizing a clock signal, said clock signal having a first phase and a second phase for each clock cycle thereof, wherein a read access cycle to a memory location of said random access memory occurs during said first phase of said clock cycle, said method including the steps of:

receiving valid data at a data bus of said random access memory for performing a write operation to a designated memory location therein; and phase shifting a write access cycle to said designated memory location one phase later relative said read access cycle.

17. The method of claim 15, further including the step of correspondingly phase shifting a precharge signal following said write access cycle to said designated memory location by said one phase.

18. The method of claim 15, wherein said plurality of memory cells are divided into two or more banks of memory cells, said designated memory location being located in a first bank of said memory cells, further including the step of inserting a wait state to delay access to a memory location in said first bank of memory cells when a read operation to said first bank of memory cells directly follows said write operation at said designated memory location.

19. The method of claim 17, further including the step of comparing addresses on an address bus of said random access memory to determine which of said memory banks will be accessed during a next read or write operation.

20. The method of claim 15, wherein said random access memory device is included in an applications specific integrated circuit.

21. The method of claim 17, wherein said wait state is a single clock cycle.

* * * * *